United States Patent [19]

Sasaki et al.

[11] 4,250,569
[45] Feb. 10, 1981

[54] SEMICONDUCTOR MEMORY DEVICE

[75] Inventors: Nobuo Sasaki, Kawasaki; Moto'o Nakano, Yokohama; Yasuo Kobayashi; Takashi Iwai, both of Kawasaki, all of Japan

[73] Assignee: Fujitsu Limited, Tokyo, Japan

[21] Appl. No.: 960,917

[22] Filed: Nov. 15, 1978

[51] Int. Cl.³ .............................................. G11C 11/40
[52] U.S. Cl. .................................. 365/185; 365/184; 307/238; 357/23
[58] Field of Search .................... 365/178, 185, 184; 307/238, 279; 357/45, 23

[56] References Cited

U.S. PATENT DOCUMENTS

| | | | |
|---|---|---|---|
| 3,728,695 | 4/1973 | Frohman-Bentchkowsky | 365/185 |
| 3,984,822 | 10/1976 | Simko et al. | 365/185 |
| 4,099,196 | 7/1978 | Simko | 365/185 |

*Primary Examiner*—Terrell W. Fears

*Attorney, Agent, or Firm*—Staas and Halsey

[57] ABSTRACT

Disclosed is a semiconductor memory device using semiconductor memory elements as memory cells. Each semiconductor memory element is provided with a semiconductor region having a particular conductivity type, a source region and a drain region both having opposite conductivity type and both being located adjacent to the semiconductor region, one on each side of the semiconductor region, so that the semiconductor region functions as a separator between the source region and the drain region, and a gate electrode which is provided over the surface of the semiconductor region on a dielectric insulation film. In the semiconductor memory device, information is written in the semiconductor memory element by injecting electric charges into the semiconductor region, and the written information is read by detecting a variation of the electrical conductance on the surface of the semiconductor region due to the injection of electric charges.

19 Claims, 15 Drawing Figures

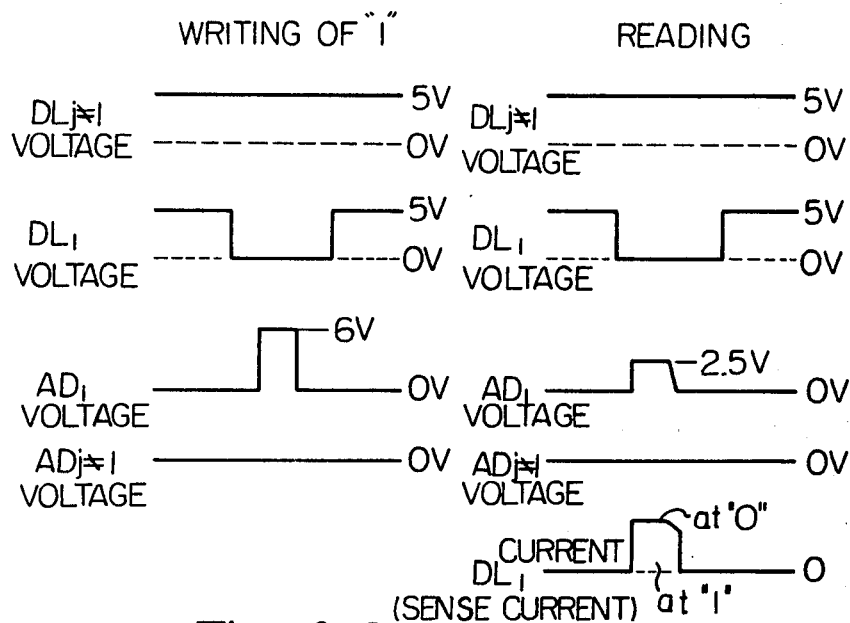
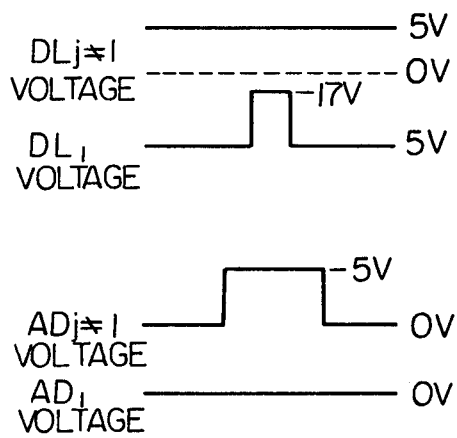

CROSS SECTION A-B IN Fig. 5A

CROSS SECTION α-β IN Fig. 6A

CROSS SECTION γ-δ IN Fig. 6A

SEMICONDUCTOR MEMORY DEVICE

FIELD OF THE INVENTION

The present invention relates to a semiconductor memory device and, more particularly, to a semiconductor memory device which can change the information written therein.

BACKGROUND OF THE INVENTION

FAMOS (Floating gate avalanche injection metal-oxide-semiconductor), SAMOS (Stacked gate avalanche injection metal-oxide-semiconductor), MNOS (Metal nitride oxide semiconductor) and 1-Transistor Cell (one transistor and one capacitance per cell) were developed in the prior art as semiconductor elements which allow change of the information written therein.

A FAMOS element provides, as disclosed in "Solid State Electronics", Vol. 17, page 517, 1974, a floating gate which is surrounded by a silicon dioxide $SiO_2$ material, wherein information is written by injecting electric charges and the charges injected thereinto are maintained in the floating gate. SAMOS provides another gate which is added to the structure of FAMOS. Such a gate is arranged on an insulating layer which is on the floating gate of the FAMOS element so as to facilitate the injection of charges into the floating gate. Information which is written in FAMOS can be erased by irradiation with ultraviolet rays. MNOS provides a silicon nitride layer ($Si_3N_4$) on a dielectric insulating layer ($SiO_2$) and a metal layer which is arranged on the silicon nitride layer, so as to form a charge trap layer between the dielectric insulating layer ($SiO_2$) and the silicon nitride layer ($Si_3N_4$). This charge trap layer has a function similar to that of the above-mentioned floating gate, that is, electric charges are injected into the charge trap layer. The so-called 1-Transistor Cell element comprises a transistor and a storage capacitor. Information is written in the storage capacitor by switching the transistor on and the information is stored therein by switching the transistor.

In the structures of FAMOS, SAMOS, and MNOS, the gate electrode should be enclosed by the insulating substance, or the insulating substance under the gate electrode should have a multilayer or a double layer construction. Therefore, the construction of each of these elements is complex, and the manufacturing of these elements is troublesome if compared to the manufacturing MOSFET (Metal-oxide-semiconductor field effect transistor).

In a 1-Transistor Cell, a capacitor is required in addition to a transistor for constructing a cell. Furthermore, when 1-Transistor Cells are used in an LSI (large scale integrated circuit), a highly sensitive amplifier is required because of the bit-line capacitance problem.

OBJECTS AND SUMMARY OF THE INVENTION

An object of the present invention is to provide a semiconductor memory device which can remove the above-mentioned drawbacks of the conventional devices and which has a simple construction.

Another object of the present invention is to provide a semiconductor memory device which can be fabricated as easily as the MOSFET's.

A further object of the invention is to provide a semiconductor memory device which can be formed from the least number of elements.

A still further object of the invention is to provide a semiconductor memory device in which stored information is sensed by detecting a current.

For the purpose of achieving the above-mentioned objects, the semiconductor memory device according to the present invention comprises semiconductor memory elements which include a semiconductor region having one type of conductivity which is floating electrically, a source region and a drain region connected to the semiconductor region and separated from each other by the semiconductor region, both having the opposite type of conductivity with respect to the semiconductor region, and a gate electrode provided over the surface of the semiconductor region. Information is written into the element by injecting charges into the semiconductor region, and the written information is read by detecting a variation of the conductance between the source and drain regions. The variation of the conductance is caused by the substrate bias effect due to the injected charges.

The semiconductor memory device according to the present invention further comprises a plurality of data lines which are connected to the source regions of the semiconductor elements and arranged in a row direction of a matrix, a plurality of address lines which are connected to the gate electrodes of the semiconductor elements and arranged in the column direction of the matrix, and a plurality of power supply lines which are connected to the drain regions of the semiconductor elements. To store the written information, the data lines are supplied with the same potential as that of the power supply and each of the address lines is grounded. To write information "1" in the semiconductor element, the potential of the data line which is connected to the source region of the semiconductor element wherein the information is to be written is maintained at zero volts; a potential higher than a threshold voltage (i.e., when the semiconductor region is p-type, the potential is of a positive value; when the semiconductor region is n-type, the potential is of a negative value) is supplied to the address line which is connected to the gate electrode of the semiconductor element wherein the information is to be written so as to form a channel under the insulating layer of the semiconductor region; and the potential applied to the address line is then rapidly decreased to a value lower than the threshold voltage so as to inject a part of minority carriers in the channel into the semiconductor region by the so-called charge pumping phenomenon to reversely bias the semiconductor region with respect to the source region (if necessary, this operation is repeated more than once). To return the bias state of the floating substrate to the original state, that is, to write the information "0", the address line which is connected to the gate of the specified memory element is maintained at zero potential and a voltage sufficient to cause an avalanche multiplication, at the junction between the floating region and the source region connected to the data line, is applied to the data line and the majority carriers generated by the avalanche multiplication are injected into the floating substrate resulting in the "0" state. To read the information stored in the semiconductor elements the data line is grounded via an electric current detector circuit, the address line is maintained at a potential higher than the threshold value in the information "0", and the current which flows in the electric current detector circuit is detected.

Further features and advantages of the present invention will be apparent from the ensuing description with reference to the accompanying drawings to which, however, the scope of the invention is in no way limited.

BRIEF DESCRIPTION OF THE DRAWINGS

FIGS. 4A, 4B and 4C are timing charts of the voltages applied to the address line during writing, reading and erasing of information in the device shown in FIGS. 3A and 3B;

DETAILED DESCRIPTION OF THE INVENTION

First of all, explanations will be given for the construction of the semiconductor memory elements which are used in the semiconductor memory apparatus of the present invention and for the function of writing and reading information of the semiconductor memory elements. In the following description, an explanation will be given in the case when N-channel transistors are used as the semiconductor memory elements; however, a similar explanation will be given in the case of the P-channel transistors.

Figure 1:
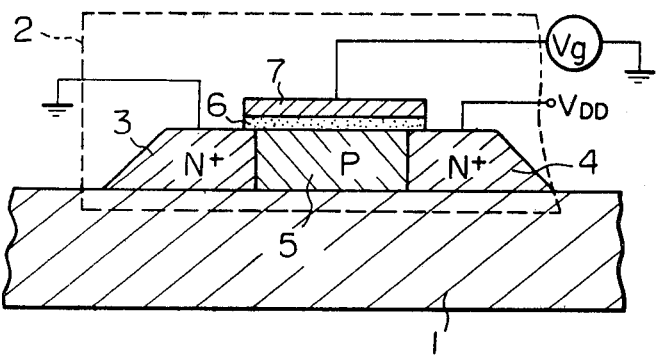
FIG. 1 shows a sectional view of the semiconductor element which is used in the semiconductor device according to the present invention.

FIG. 1 shows a sectional view of the semiconductor memory element used in the device of the present invention. Referring to FIG. 1, reference numeral 1 designates a dielectric substrate which is made from a material such as sapphire, and reference numeral 2 designates the semiconductor memory element which is formed on the dielectric substrate 1. The semiconductor memory element 2 comprises a source 3 and a drain 4, which are both made from an N+-type silicon semiconductor material. The element 2 further comprises a floating substrate 5 which is positioned between the source 3 and the drain 4 and made from a P-type silicon semiconductor material, a dielectric film 6 which is provided on the floating substrate 5 and which is made from a material such as silicon dioxide $SiO_2$, and a gate electrode 7 which is provided on the dielectric film 6.

Here, the following convention is used to designate a "1" or "0". If the floating substrate 5 is negatively charged up with respect to the source 3, a "1" is stored. If the potential of the floating substrate 5 is approximately equal to that of the source 3, a "0" is stored.

To write "1" into the semiconductor element shown in FIG. 1, the source 3 is grounded and a positive voltage is applied to the drain 4. Thereafter, a positive voltage, which is higher than the threshold voltage Vth, is applied to a gate electrode 7 so that a channel is formed in the floating substrate 5 under the dielectric film 6. Next, the gate electrode potential is rapidly decreased to a value smaller than the threshold voltage. When the gate electrode potential is rapidly decreased, some of the electrons in the channel are injected into the floating substrate 5 by a charge pumping effect. When the channel is formed, electrons in the channel are supplied from the source 3, therefore, when the gate is grounded the floating substrate 5 under the gate electrode 7 is negatively biased with respect to the source 3. At this time, the source 3 and the floating substrate 5 are connected via a P-N junction which is reversely biased, and the floating substrate 5 is maintained at a state which is negatively biased to the source 3. This state is defined as state "1", and the initial state is defined as state "0".

State "1" corresponds to the MOS field effect transistor MOSFET to which the back gate bias is applied. Therefore, the current which flows when the voltage $V_{DD}$ is applied to the drain region is small as compared to the current which flows when the floating substrate 5 has the same potential as that of the source 3, i.e., the semiconductor memory element has information "0".

When information "1" stored in the semiconductor memory element is erased so as to change information "1" to information "0", the negative bias applied to the floating substrate must be erased. The negative bias applied to the floating substrate can be erased by, for example:

(1) raising the temperature of the whole semiconductor memory element, (2) irradiating with light so as to increase the amount of the leakage current in the reverse-biased P-N junction, (3) applying a positive potential to the gate electrode so as to collect the negative charges in the floating substrate into the channel formed at the interface between the dielectric layer 6 and the floating substrate 5 and then slowly decreasing the gate potential so as to prevent the charge pumping effect, (4) combining the methods of (1) and (3) or the methods of (2) and (3), (5) applying to the source a voltage which is sufficient to cause an avalanche multiplication to occur at the P-N junction between the source and the floating substrate and then injecting the holes which are generated by the avalanche multiplication into the floating substrate.

The above-mentioned methods (1), (2) and (4) are used when all of the information stored in the semiconductor memory apparatus is changed to the value "0", and methods (3) and (5) are used when the information stored in the specified semiconductor memory elements is changed to the value "0".

Figure 2A:
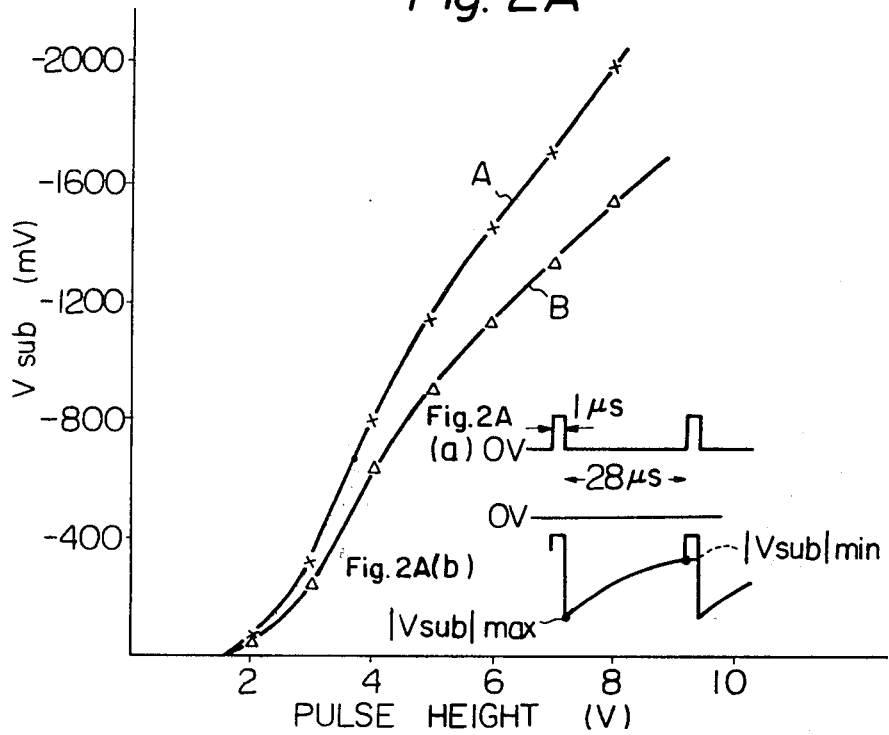
FIGS. 2, 2A(a), 2A(b), 2B, 2B(a), 2B(b), 2C and 2D are diagrams showing the characteristic features of the semiconductor element shown in FIG. 1.
Figure 2B:
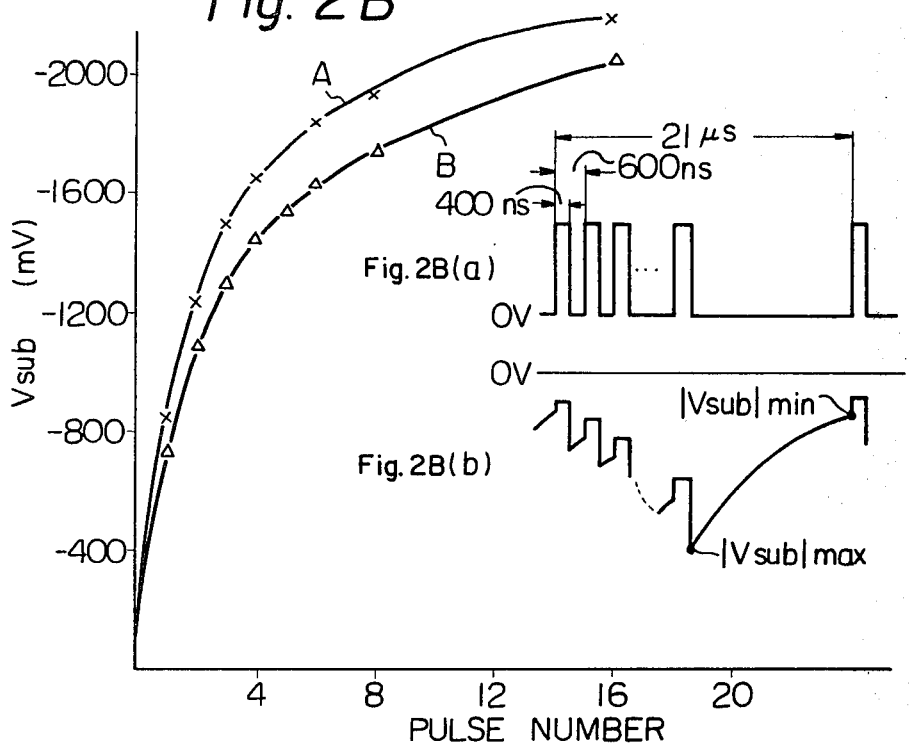
Figure 2C:
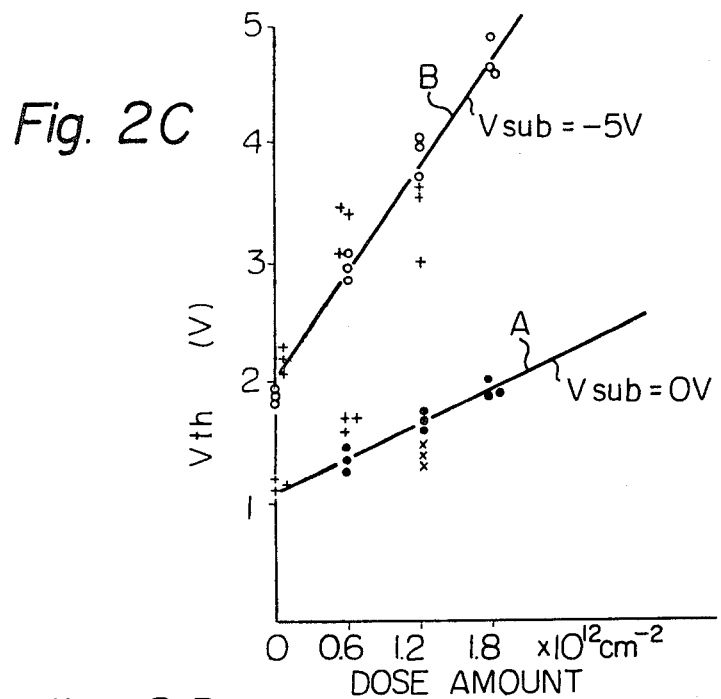
Figure 2D:
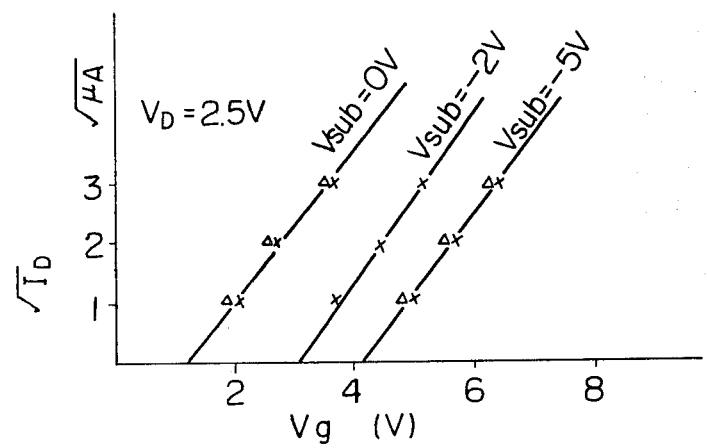

FIGS. 2A through 2D show the characteristic curves of the semiconductor element shown in FIG. 1. FIG. 2A shows the relationship between the potential of the floating substrate and the peak value of the input pulses. Referring to FIG. 2A, peak values of the input pulses having a period of 28 μS and a width of 1 μS are plotted on the abscissa, as shown by FIG. 2A(a), and values of the potential existing in the floating substrate are plotted on the ordinate, as shown by FIG. 2A(b). Referring to FIG. 2A, curve A shows the value (mV) of the maximum absolute floating substrate potential |Vsub|max and curve B shows the value of the minimum absolute floating substrate potential |Vsub|min, as defined by FIG. 2A(b). Fall time of the applied pulses is about 10 ns. FIG. 2B shows the relationship between the potential of the floating substrate and the number of input pulses. Referring to FIG. 2B, the number of pulses having a period of 600 ns and a pulse width of 400 ns within the period of 21 μs as shown by FIG. 2B(a) are plotted on the abscissa, and values of the potential (mV) existing in the floating substrate as shown in FIG. 2B(b), which is varied by the application of pulses by FIG. 2B(b), are plotted on the ordinate. Referring to FIG. 2B, curve A shows the potential |Vsub|max, curve B shows the potential |Vsub|min, as defined in FIG. 2B(b), and the fall time of the applied input pulses is about 10 ns. FIG. 2C shows the variation of the threshold value as a function of the dose level of boron ions which are implanted into the floating substrate at 150 KeV. Referring to FIG. 2C, curve A corresponds to the case where the potential of the floating substrate is 0 volt, and curve B corresponds to the case where the potential of the floating substrate is −5 volts. FIG. 2D shows the relationship between the gate voltage and the drain current of the semiconductor element having the floating substrate wherein boron ions are implanted at 150 KeV to the dose level of $1.8 \times 10^{12}$ cm$^{-2}$. Referring to FIG. 2D, the values of the potentials of the floating substrate are respectively 0 volt, −2 volts and −5 volts, and the drain voltage is 2.5 volts. The characteristics shown in FIG. 2D relate to a sample wherein the thickness of the silicon film is 1 μm and the thickness of the gate oxide is 760 Å.

Figure 3A:
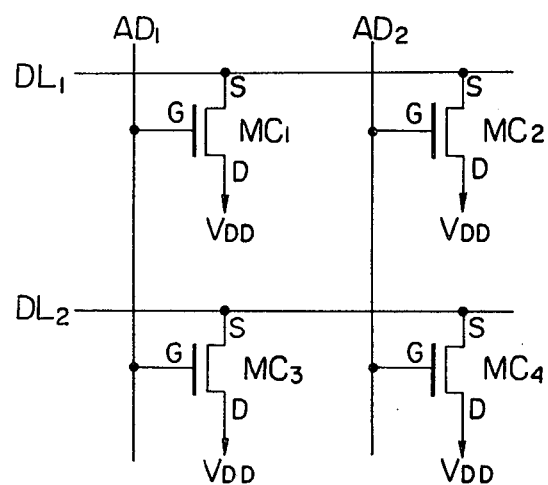
FIGS. 3A and 3B are partial circuit diagrams of the device according to the present invention.
Figure 3B:
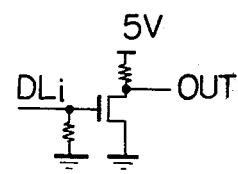

FIGS. 3A and 3B respectively show circuit diagram of the semiconductor memory apparatus using the semiconductor memory elements shown in FIG. 1. Referring to FIG. 3A, symbols $MC_1$ through $MC_4$ designate semiconductor memory elements, $DL_1$ and $DL_2$ designate date lines which are connected to the sources of the semiconductor memory elements and $AD_1$ and $AD_2$ designate address lines which are connected to the gates of the semiconductor elements. The drain of each semiconductor memory element is connected to a power supply of voltage $V_{DD}$.

Referring to FIG. 4A, explanation will now be given for the case where information is written in a specified memory element, for example, $MC_1$ of the semiconductor memory apparatus shown in FIG. 3A. In this case, it is assumed that the transistors exhibiting the characteristics shown in FIG. 2D are used as the semiconductor memory elements. The threshold value Vth of each semiconductor memory element MC is 1.3 volts when each element is not charge pumped (i.e., "0" is stored), and the power supply voltage $V_{DD}$ is 5 volts. When the semiconductor memory device is in the "Store" state, a potential which is the same as that of the power supply voltage $V_{DD}$ is applied to the data line DL and each address line AD is grounded.

To write the information "1." in the memory element $MC_1$, the data line $DL_1$ which is connected to the memory element $MC_1$ is first grounded at zero volts, then a pulse exhibiting a peak 6 V as shown in FIG. 4A is supplied to the address line $AD_1$ which is connected to the memory element, and the other address lines are each maintained at zero volts. Next, the potential of the address line $AD_1$ is rapidly returned to zero volts. The fall time may be, for example 20 ns. In this writing operation, the charges are pumped into the floating substrate of the memory element $MC_1$, and then the floating substrate is negatively biased so that information "1" is written in the floating substrate. By repeating this charge pumping action, the amount of negative bias can be increased as shown in FIG. 2B. By using only one charge pumping action, the potential of the floating substrate is changed to the order of −1.3 volts when the data line $DL_1$ is maintained at zero volt, as shown in FIG. 2A, and the threshold voltage Vth is changed to 2.7 volts, as shown by interpolation of FIG. 2D. After the potential of the data line $DL_1$ is returned to 5 volts, information "1" which is written in the memory element $MC_1$ is maintained. In this state, the floating substrate is reverse-biased to the source and drain, and the information is stored. Since the information "1" stored in the floating substrate gradually disappears due to the leakage current of the reverse-biased junctions at the source and drain, a refresh operation is required at a certain time interval.

To read the stored information in the semiconductor memory element $MC_1$, the data line $DL_1$ is grounded via an electric current detecting circuit and the address line $AD_1$ is then maintained at +2.5 volts, as shown in FIG. 4B. If the "0" is stored in the memory element the channel is formed under the gate electrode of the semiconductor memory element $MC_1$ so as to permit the current to flow through the data line $DL_1$. However, if the "1" is stored in the memory element, then the current flowing through $DL_1$ is smaller than the current flowing therethrough when "0" is stored in the memory element because of the substrate bias effect. Accordingly, by using an electric current detector to read this current, the information stored in the memory element $MC_1$ can be read out. When the voltage of 2.5 volts applied to the address line $AD_1$ is decreased to zero volts after the read-out operation is finished, the decreasing operation is carried out slowly so as to decrease the charge pumping effect.

The utilization of avalanche multiplication to write information "0" into the semiconductor memory element $MC_1$ will now be explained. As shown in FIG. 4C, the potential of the address lines except for $AD_1$ is put at 5 volts and a voltage of 17 volts is supplied to the data line $DL_1$ so that an avalanche multiplication is caused in the memory element $MC_1$; however, no avalanche multiplication is caused in the memory element $MC_2$ because a voltage of 5 volts is supplied to the address line $AD_2$. Therefore, holes are injected into the floating substrate of the memory element $MC_1$ by the avalanche multiplication so that information "0" is written into the memory element $MC_1$. That is, to write information "1" into the memory element $MC_1$, electrons are injected into the floating substrate by carrying out the charge pumping action, whereas, to write the information "0" into the memory element, the holes are injected into the floating substrate by using the avalanche multiplication phenomenon.

When the information in all the memory elements is required to be changed to information "0" at once, the temperature of the whole semiconductor memory apparatus is raised or light is irradiated on the whole semiconductor memory device.

Figure 5A:
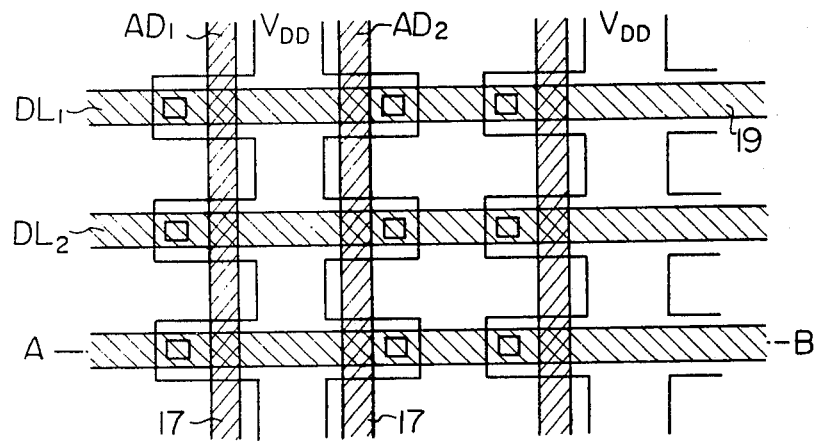
FIGS. 5A and 5B are, respectively, a plan view and a sectional view of one embodiment of the device according to the present invention.
Figure 5B:
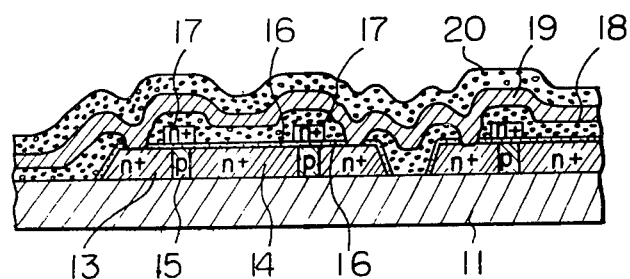

FIGS. 5A and 5B respectively show one embodiment of the semiconductor memory device according to the present invention. Referring to the plan view of the device shown in FIG. 5A, address lines $AD_1$, $AD_2$ and data lines $DL_1$, $DL_2$ correspond to those shown in FIG. 3A. Referring to the cross-sectional view of the device shown in FIG. 5B, reference numerals 11, 13, 14, 15, 16 and 17 correspond to the dielectric substrate 1, source 3, drain 4, floating substrate 5, insulating film 6 and gate electrode 7, respectively, shown in FIG. 1, and the gate 17 is formed of a polysilicon layer. Furthermore, reference numeral 18 designates a phospho-silicate glass film, reference numeral 19 designates an aluminum layer and reference numeral 20 designates a phospho-silicate glass layer. With respect to the device shown respectively in FIGS. 5A and 5B, which device is formed by using N-channel type semiconductor elements: the thickness of gate oxide film 16 is 760 Å, and the thickness of the epitaxial silicon film is 1 μm; the implantantion energy of boron B+ for the silicon film is 150 KeV and the dose level of boron B+ is $1.8 \times 10^{12}$ cm$^{-2}$; the thickness of the polysilicon layer of gate 17 is 0.4 μm; the energy for As+ implantation for forming the source and the drain is 150 KeV; the dose level of As+ implantation is $4 \times 10^{15}$ cm$^{-2}$; the thickness of the phopho silicate glass is 0.8 μm; and the threshold voltage of the N-channel element thus manufactured is 1.3 volts for Vsub=0 volt and 3 volts for Vsub=−2 volts, wherein Vsub is the potential of the floating substrate with respect to the source.

Actuation of the device shown in FIGS. 5A and 5B will now be explained. If we assume that the power supply voltage is 5 volts, then the peak value of the voltage applied to the data line which is connected to the memory cell to be charge pumped will be:

$$V_{DD} + Vth = 5 + 1.3 V = 6 V,$$

while the other address lines are each maintained at zero volt, the data line connected to the cell is maintained at zero volts and the other data lines are each maintained at 5 volts. In this condition, the channel is formed only in the memory cell to be charge pumped; therefore, charge pumping of the other memory cells does not occur. If the voltage applied to the address line of the specified memory cell during reading out of information stored in the memory cell is 2.5 volts and with the substrate voltage in the memory element cell with the written "1" is about 1.3 volts according to the discussion above in connection with FIG. 2D, then the threshold; voltage Vth is shifted to 2.7 volts according to such experimental data. If the read-out information is "0", the threshold voltage is 1.3 volts and the threshold voltage is less than the gate voltage of Vg=2.5 volts, so that current will flow in the data line. If the read-out information is "1", the threshold voltage is 2.7 volts and the threshold voltage is greater than the voltage Vg, so that no current will flow in the data line. Transformation of this current into a voltage can be easily carried out, for example, by connecting a resistor together with the transistor at the terminal of the data line as shown in FIG. 3B.

Figure 6A:
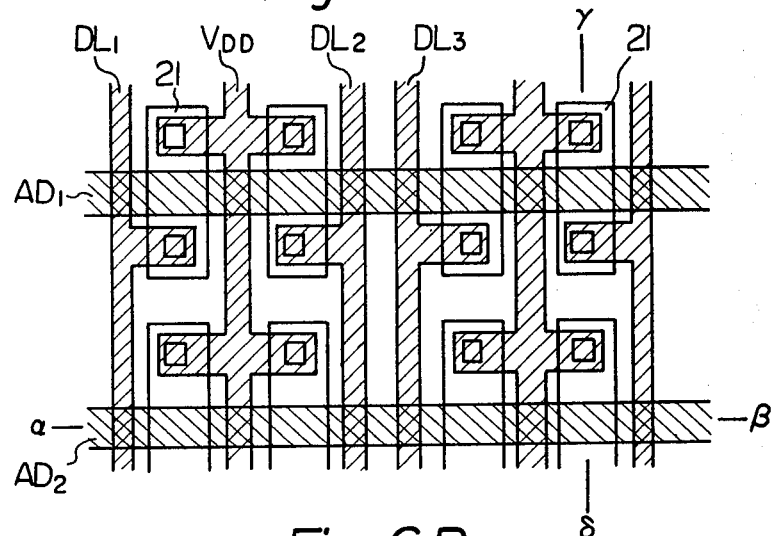
FIGS. 6A, 6B and 6C are a plan view and two sectional views of another embodiment of the device according to the present invention.
Figure 6B:
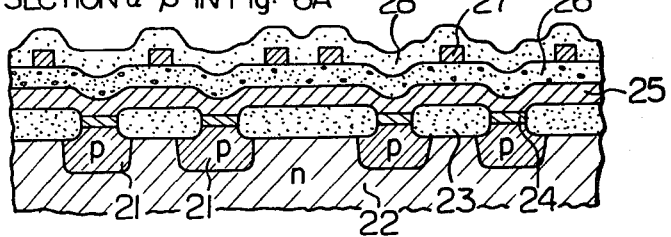
Figure 6C:
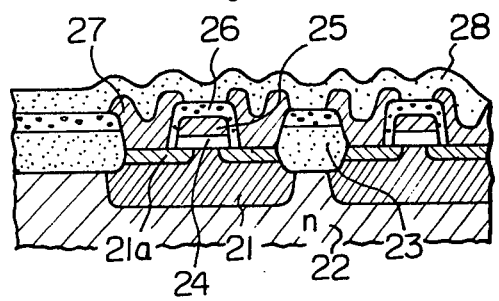

FIGS. 6A, 6B and 6C respectively show another embodiment of the semiconductor memory device according to the present invention. These figures show a bulk floating substrate memory using a P-well. Referring to FIG. 6A, data lines $DL_1$, $DL_2$ and $DL_3$ and address lines $AD_1$ and $AD_2$ correspond respectively to those shown in FIG. 3A, and reference numeral 21 designates a P-well. FIGS. 6B and 6C show layer 22, a P-well layer 21, an N+-type layer 21a, a gate oxide film layer 24, address lines 25 which are gates formed of a polysilicon layer, a PSG layer 26, data line 27 which are formed from an aluminum layer, and a PSG layer 28. Referring to FIGS. 6B and 6C, the substrate 22 is an N-type layer (impurity concentration of which is $2 \times 10^{15}$ cm$^{-3}$), the thickness of the gate oxide film is 1000 Å, the P-well layer is a p-type layer (impurity concentration of which is $1 \times 10^{16}$ cm$^{-3}$ and the depth thereof is 3 μm), the threshold voltage of the element is 1.42 volts when the potential of the P-well Vsub is 0 volt with respect to the source and the threshold value of the element is 3.0 volts when the potential of the P-well Vsub is −2 volts.

For storing information in the memory cells, all of the data lines $DL_1$ are maintained at $V_{DD}$ volts and all of the address lines $AD_1$ are maintained at zero volts. For the purpose of writing information "1" to the specified memory cell $MC_1$ only, the data line $DL_1$ is lowered to O V and the voltage which is about $V_{DD}+Vth$ is applied to the address line $AD_1$ and then returned to O V rapidly, so that the charge pumping phenomenon occurs and the P-well is negatively charged up by the source. For the purpose of writing information "0" in the P-well, that is, the potential of the P-well is equal to that of the source, the following methods can be used:

(a) a method of irradiating with light (wherein all address and data lines are maintained at zero volts), (b) a method of heating all of the memory cells (wherein all address and data lines are maintained at zero volts), (c) a method of maintaining the data line $DL_1$ at zero volts, supplying a voltage equal to the threshold voltage or greater than the threshold voltage to the address line $AD_1$ for collecting the negative charges in the P-well into the channel, and then causing the voltage of the address line $AD_1$ to slowly return to zero volts so as to prevent the occurrence of the charge pumping phenomenon (only the specified cell $MC_1$ is returned to the value "0"), (d) a method of carrying out the operation of method (c) with respect to all data and address lines simultaneously with the operation of method (a) or (b), and (e) a method of supplying to the data line $DL_1$ a voltage which can cause an avalanche multiplication between the data line $DL_1$ and the P-well when $AD_1=0$ volts and injecting holes into the P-well of the cell $MC_1$ so as to make the specified cell $MC_1$ only in the value "0".

Furthermore, it is understood that a similar semiconductor memory device can be formed by means of a P-channel transistor using an N-well.

As mentioned above, according to the present invention, it is possible to fabricate a semiconductor memory device in which the content of stored information can be changed, by using a similar fabrication method to that used for fabricating a MOSFET having an SOS construction or a CMOS having a bulk construction. Furthermore, the construction of the semiconductor memory element of the present invention is simple as compared to that of a conventional memory element such as FAMOS, SAMOS and MNOS, and therefore, the semiconductor memory device of the present invention can be manufactured cheaply. Furthermore, according to the present invention, 1 bit of information can be handled by only one transistor; therefore, an integrated circuit having high density can be obtained by using the present invention as compared to the so-called 1-Transistor Cell, which requires both one transistor and one capacitor.

What is claimed is:

1. A semiconductor memory device comprising semiconductor memory elements, each said memory element having a gate threshold voltage for electrical conductance of said element that is a function of the information stored in said element, each said semiconductor memory element comprising a semiconductor region having one type of conductivity and being floating electrically, a source region and a drain region located adjacent to said semiconductor region and separated by said semiconductor region and both having the opposite type of conductivity with respect to said semiconductor region, each of said source and drain regions being connected to a respective electrode, a gate electrode over the surface of and insulated from said semiconductor region, means for writing information into a selected one of said elements by injecting charges into the respective one of said semiconductor regions and means for reading said stored information by detecting a variation of said electrical conductance of said selected element, said writing and reading means comprising means for applying selected potentials to said three electrodes of each said memory element.

2. A semiconductor memory device according to claim 1, further comprising a plurality of data lines connected to said electrodes of said source regions of said semiconductor elements and arranged in the row direction of a matrix pattern, a plurality of address lines connected to said gate electrodes of said semiconductor elements and arranged in the column direction of said matrix pattern, a power supply connected to said electrodes of said drain regions of said semiconductor elements, means for storing said information written into each one of said elements by applying to the respective one of said data lines a first potential and to the respective one of said address lines a second potential, said first and second potentials providing a reverse bias between the respective one of said semiconductor regions and the respective adjacent source and drain regions corresponding to said selected element, and said means for writing comprising means for grounding the respective one of said data lines connected to said selected semiconductor element and for applying a third potential of value larger than said threshold voltage to the respective one of said address lines which is connected to the respective one of said gate electrodes and then rapidly decreasing the value of said third potential below said threshold voltage, so as to inject minority carriers into said semiconductor region from said source region of said selected element.

3. A semiconductor memory device according to claim 2 comprising means for erasing said written information in said selected one of said elements by applying a voltage to the respective one of said data lines corresponding to said selected element to cause avalanche multiplication at said junction between the respective one of said semiconductor regions and the respective one of said adjacent source regions corresponding to said selected element.

4. A semiconductor memory device according to claim 2, comprising means for erasing said stored information by applying a voltage which is equal to or larger than the value of said threshold voltage, when said selected memory element is storing said charge corresponding to said information, to the respective data line.

5. A semiconductor memory device according to claim 2, said means for reading comprising means for applying a fourth potential to said respective one of said address lines, said fourth potential having a value between said threshold voltages of said selected element with and without said stored information, and further comprising means for grounding said respective one of said data lines through an electric current detector circuit.

6. A semiconductor memory device according to claim 2, wherein said means for writing comprises means for repeating said application and decrease of said third potential.

7. The device of claim 2, said first potential comprising that of said power supply, and said second potential comprising ground voltage.

8. The device of claim 2 or 7, said drain regions being connected to said power supply by an electrode extending parallel to said address lines.

9. The device of claim 2 or 7, said drain regions being connected to said power supply by an electrode extending parallel to said data lines.

10. A semiconductor memory device having plural memory elements, each memory element comprising an electrically floating region of P type conductivity, source and drain regions of N type conductivity adjoining and separated by said P type region at a respective pair of junctions, an insulated gate on the surface of said P type region, writing means for applying a first set of voltages to said gate and N type regions for injecting minority carriers into said P type region, and reading means for applying a second set of voltages to said gate and N type regions and for measuring current flowing between said source and drain regions, said second set of voltages resulting in a different value for said current depending upon the amount of said injected minority carriers.

11. The device of claim 10, each said element comprising storing means for storing said injected charges by applying a third set of voltages to said gate and N regions for reverse biasing both said junctions.

12. The device of claim 10, said first set of voltages comprising values for forward biasing said junction between said P and source regions to a greater extent than said junction between said P and drain regions and for subsequently reverse biasing each of said junctions.

13. The device of claim 12, said writing means comprising means for providing said first set of voltages to have a voltage pulse of approximately 6 volts applied to said gate, ground potential applied to said source region, and approximately 5 volts applied to said drain region, said voltage applied to said gate having a pulse width of approximately 400 to 1000 ns.

14. The device of claim 13, said writing means comprising means for repeatedly applying said first set of voltages.

15. The device of claim 12, said reading means comprising means for providing said second set of voltages so that after the operation of said writing means said current is approximately zero.

16. The device of claim 12, said second set of voltages comprising ground potential applied to said source, and approximately 2.5 volts applied to said gate.

17. The device of claim 12 comprising erasing means for cancelling the effect of any of said injected minority carries by applying a fourth set of voltages to said gate and source regions.

18. The device of claim 17, said erasing means comprising voltage means for producing avalanche breakdown in at least one of said junctions.

19. The device of claim 17, said fourth set of voltages comprising ground potential applied to said source region and a gradually decreasing potential applied to said gate, said gradually decreasing potential having an initial value large enough to cause conductivity between said source and drain regions in conjunction with the potential applied to said drain region.

* * * * *

UNITED STATES PATENT AND TRADEMARK OFFICE
CERTIFICATE OF CORRECTION

PATENT NO. : 4,250,569  Page 1 of 2

DATED : February 10, 1981

INVENTOR(S) : Sasaki et al.

It is certified that error appears in the above—identified patent and that said Letters Patent is hereby corrected as shown below:

\*Cover page, item [73] Assignee, "Tokyo," should be
--Kawasaki--;
        \*item [57] Abstract, line 5, at the end of the line insert --the--.
Column 1, line 51, change "facturing MOSFET" to --facturing of MOSFETs--.
Column 2, line 49, after "voltage" insert --,--;
        line 50, "a part of" should be --some of the--.
\*Column 3, line 24, after "invention;" insert --and--;
        \*line 25, after "are" insert --, respectively,--.
Column 4, line 6, "3," should be --3;--;
        \*line 39, after "(3)," insert --and--.
\*Column 5, line 15, "volt," should be --volts,--;
        \*line 22, "volt," should be --volts,--;
        line 27, "diagram" should be --diagrams--;
        line 32, "date" should be --data--;
        line 55, after "peak" insert --value of--.
\*Column 6, line 1, "volt," should be --volts,--.
Column 7, line 6, "implantantion" should be --implantation--;

UNITED STATES PATENT AND TRADEMARK OFFICE
CERTIFICATE OF CORRECTION

PATENT NO. : 4,250,569

DATED : February 10, 1981

INVENTOR(S) : Sasaki et al.

It is certified that error appears in the above—identified patent and that said Letters Patent is hereby corrected as shown below:

line 12, "phospho silicate" should be --phospho-silicate--;
    *line 14, "volt" should be --volts--;
    *line 27, "volt," should be --volts,--;
     line 36, "1.3" should be -- -1.3--;
     line 37, "threshold;" should be --threshold--;
     line 56, after "show" insert --an N-type--;
     line 57, after "21a," insert --a field oxide layer 23,--;
     line 59, "line" should be --lines--;
    *line 68, "volt" should be --volts--.
*Column 9, line 43, "2" should be --2,--;
     line 52, "2," should be --2 or 7,--;
     line 58, "2," should be --2 or 7,--;
     line 67, "2," should be --2 or 7,--.
*Column 10, line 53, "12" should be --12,--;
     line 55, "carries" should be --carriers--.

Signed and Sealed this

Twenty-ninth Day of September 1981

[SEAL]

Attest:

GERALD J. MOSSINGHOFF

Attesting Officer     Commissioner of Patents and Trademarks